(12) United States Patent
Zhang et al.

(10) Patent No.: US 10,475,825 B2
(45) Date of Patent: Nov. 12, 2019

(54) TFT BACKPLANE AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Liangfen Zhang, Guangdong (CN); Xiaoxing Zhang, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/045,054

(22) Filed: Jul. 25, 2018

(65) Prior Publication Data

US 2019/0273103 A1    Sep. 5, 2019

Related U.S. Application Data

(63) Continuation of application No. PCT/CN2018/087315, filed on May 17, 2018.

(30) Foreign Application Priority Data

Mar. 5, 2018    (CN) .......................... 2018 1 0179641

(51) Int. Cl.
*H01L 27/12*    (2006.01)
*H01L 21/311*    (2006.01)
(Continued)

(52) U.S. Cl.
CPC .... *H01L 27/1259* (2013.01); *H01L 21/31116* (2013.01); *H01L 23/5329* (2013.01);
(Continued)

(58) Field of Classification Search
CPC ............. H01L 27/1259; H01L 29/0603; H01L 23/5329; H01L 29/7869; H01L 29/66045; H01L 21/31116; H01L 29/41733
See application file for complete search history.

(56) References Cited

U.S. PATENT DOCUMENTS

2015/0187697 A1\* 7/2015 Kuo .................. H01L 21/31055
257/773
2016/0315105 A1\* 10/2016 Lv ........................ H01L 27/1255

FOREIGN PATENT DOCUMENTS

CN    104752344 A    7/2015

\* cited by examiner

*Primary Examiner* — Andrew Sasinowski
(74) *Attorney, Agent, or Firm* — Leong C. Lei

(57) ABSTRACT

The invention provides a TFT backplane and manufacturing method thereof, wherein the TFT backplane comprises a substrate (1); a gate (11) and a first metal electrode (21) formed on the substrate (1); a gate insulating layer (31) formed on the substrate (1) and covering the gate (11) and the first metal electrode (21), the gate insulating layer (31) on the first metal electrode (21) having a thickness less than thickness of the gate insulating layer (32) on the gate (11); an etch stop layer (ESL) (5) on the gate insulating layer (31) and a second metal electrode (22) on the ESL (5). Only a portion of the gate insulating layer deposited on the first metal electrode is etched away, and the first metal electrode always protects the gate insulating layer, so that the first metal electrode is not damaged by the etching gas, favorable for the final storage capacitor.

8 Claims, 3 Drawing Sheets

(51) Int. Cl.
  *H01L 29/66* (2006.01)
  *H01L 29/06* (2006.01)
  *H01L 29/786* (2006.01)
  *H01L 23/532* (2006.01)
  *H01L 29/417* (2006.01)
(52) U.S. Cl.
  CPC .... *H01L 29/0603* (2013.01); *H01L 29/41733* (2013.01); *H01L 29/66045* (2013.01); *H01L 29/7869* (2013.01)

TFT BACKPLANE AND MANUFACTURING METHOD THEREOF

CROSS REFERENCE TO RELATED APPLICATIONS

This application is a continuing application of PCT Patent Application No. PCT/CN2018/087315, entitled "TFT BACKPLANE AND MANUFACTURING METHOD THEREOF", filed on May 17, 2018, which claims priority to Chinese Patent Application No. CN201810179641.6, filed on Mar. 5, 2018, both of which are hereby incorporated in its entireties by reference.

BACKGROUND OF THE INVENTION

1. Field of the Invention

The present invention relates to the field of display and, in particular, to the field of a thin film transistor (TFT) backplane and manufacturing method thereof.

2. The Related Arts

The known thin film transistor (TFT) array substrate comprises a substrate and TFTs and storage capacitors formed on the substrate. The storage capacitor is mainly used to allow the charged voltage to be maintained until the next screen update. In the manufacturing process of a TFT array substrate, a parallel plate capacitor is formed by using a display electrode and a gate line (Cst on gate) as a storage capacitor.

A structure of a conventional storage capacitor 2' is shown in FIG. 1, which comprise a first metal electrode 21' obtained by patterning a first metal layer deposited on a substrate 1', an etch stop layer (ESL) 5' as a sandwiched layer of the storage capacitor 2', and a second metal electrode 22' obtained by patterning a second metal layer deposited on the etch stop layer 5'. In the manufacturing process of the storage capacitor 2', a gate insulating layer 3' deposited on the first metal electrode 21' must be completely etched by a dry etching process before depositing the etch stop layer 5', which exposes the first metal electrode 21' to the etching gas, and can easily damage the first metal electrode 21', resulting in poor electrical performance of the storage capacitor, affecting the stability of the entire TFT array substrate, and even causing the performance loss of the final display device.

SUMMARY OF THE INVENTION

The primary object of the present invention is to provide a TFT backplane and manufacturing method thereof, able to reduce defects and improve stability.

To solve the above technical issue, the present invention provides a TFT backplane, which comprises:
a substrate;
a gate and a first metal electrode formed on the substrate;
a gate insulating layer formed on the substrate and covering the gate and the first metal electrode, the gate insulating layer on the first metal electrode having a thickness less than thickness of the gate insulating layer on the gate;
an etch stop layer (ESL) on the gate insulating layer and a second metal electrode on the ESL, the first metal electrode, the gate insulating layer, the ESL and the second metal electrode forming a storage capacitor.

Preferably, the gate insulating layer on the gate comprises two stacked layers of non-metal films and the gate insulating layer on the first metal electrode comprises a layer of non-metal film.

Preferably, the first metal electrode and the second metal electrode are made of any one or combination of: aluminum, molybdenum, titanium, and copper, and is formed by a process of physical vapor deposition, chemical vapor deposition, vapor deposition, or printing.

Preferably, the TFT backplane further comprises:
an oxide semiconductor layer on the gate insulating layer;
the ESL layer on the gate insulating layer and the oxide semiconductor layer; and
a source and a drain on the ESL, the source and the drain contacting the oxide semiconductor layer.

Preferably, the ESL comprises a first contact hole and a second contact hole respectively corresponding to above the oxide semiconductor layer, and the source contacts the oxide semiconductor layer through the first contact hole, and the drain contacts the oxide semiconductor layer through the second contact hole.

Preferably, the TFT backplane further comprises:
a passivation layer on the source, the drain, the second metal electrode and the ESL;
a planarization layer on the passivation layer;
a pixel definition layer and a pixel electrode layer on the planarization layer.

Preferably, the passivation layer and the planarization layer comprise a third contact hole at a position corresponding to the drain, the pixel definition layer comprises a fourth contact hole at a position corresponding to the third contact hole, the pixel electrode layer contacts the drain through the fourth contact hole and the third contact hole.

The present invention also provides a TFT backplane manufacturing method, which comprises the following steps:
providing a substrate, forming a first metal layer on the substrate, and patterning the first metal layer to obtain a first metal electrode;
forming a gate insulating layer on the substrate the first metal electrode, performing partial etching on the gate insulating layer with a dry etch process to obtain a gate insulating layer with reduced thickness;
forming an etch stop layer (ESL) on the gate insulating layer with reduced thickness, forming a second metal layer on the ESL, patterning the second metal layer to obtain a second metal electrode.

Preferably, the step of patterning the first metal layer further obtains a gate, and then forming the gate insulating layer on the first metal electrode and the gate; the gate insulating layer on the first metal electrode, after thickness reduced, has a thickness less than thickness of the gate insulating layer on the gate.

Preferably, the TFT backplane manufacturing method further comprises:
forming an oxide semiconductor layer on the gate insulating layer on the gate;
forming an ESL on the gate insulating layer on the gate and the oxide semiconductor layer, forming the second metal layer on the ESL, patterning the ESL to obtain a source and a drain, the source and the drain contacting the oxide semiconductor layer;
forming a passivation layer on the source, the drain, the second metal electrode and the ESL;
forming a planarization layer on the passivation layer;
forming a pixel definition layer and a pixel electrode layer on the planarization layer.

The embodiments of the present invention provide the following advantages: in the process of manufacturing the storage capacitor, only a portion of the gate insulating layer deposited on the first metal electrode is etched through the dry etch process before depositing the etch stop layer, so that the gate insulating layer on the first metal electrode maintains a certain thickness, the first metal electrode remains protected by the gate insulating layer, so that the first metal electrode is not damaged by the etching gas, which is favorable for the stability of the final storage capacitor, improves the stability of the TFT backplane, and reduces the defects.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

The terms "comprising" and "having" and any variations thereof appearing in the specification, claims, and drawings of the present application are intended to cover non-exclusive inclusion. For example, a process, method, system, product, or device that includes a series of steps or units is not limited to the listed steps or units, but optionally also includes steps or units not listed, or alternatively, other steps or units inherent to these processes, methods, products or equipment. In addition, the terms "first", "second" and "third" are used to distinguish different objects and not intended to describe a particular order.

Figure 1:
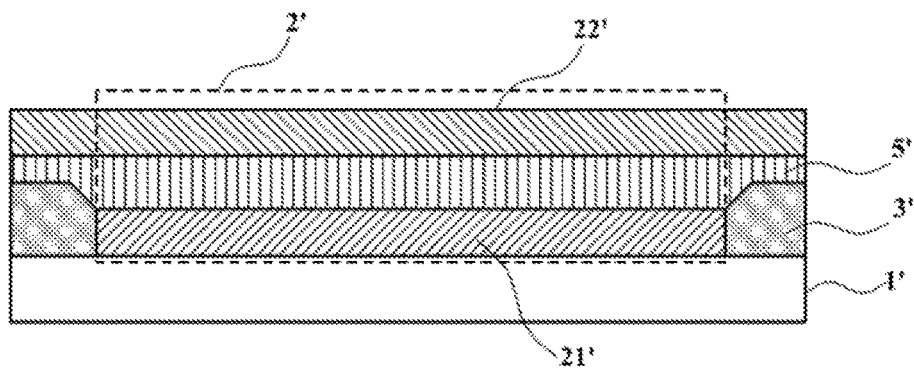
FIG. 1 is a schematic view showing the structure of a known storage capacitor.
Figure 2:
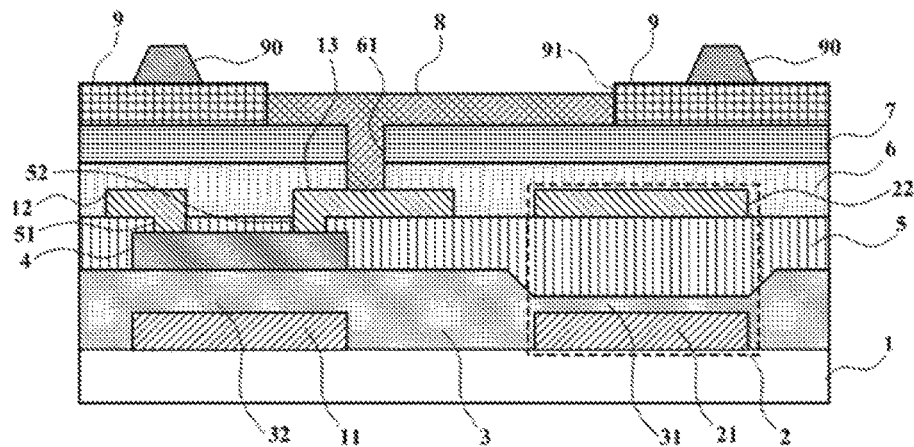
FIG. 2 is a schematic view showing the structure of the TFT backplane according to the first embodiment of the present invention.

Referring to FIG. 2, the present invention provides a TFT backplane, which comprises:
a substrate 1;
a gate 11 and a first metal electrode 21 formed on the substrate 1;
a gate insulating layer 3 formed on the substrate 1 and covering the gate 11 and the first metal electrode 21, the gate insulating layer 31 on the first metal electrode 21 having a thickness less than thickness of the gate insulating layer 32 on the gate 11;
an etch stop layer (ESL) 5 on the gate insulating layer 31 and a second metal electrode 22 on the ESL 5, the first metal electrode 21, the gate insulating layer 31, the ESL 5 and the second metal electrode 22 forming a storage capacitor 2.

In the process of manufacturing the storage capacitor 2 provided by the embodiment of the present invention, before depositing the etch stop layer 5, only a portion of the gate insulating layer 3 deposited on the first metal electrode 21 is etched by a dry etch process, so that the gate insulating layer 31 on the first metal electrode 21 retains a certain thickness (specific retention thickness can be determined according to the actual design of the TFT backplane). Compared with the gate insulation layer 32 on the gate 11, it is equivalent to a thickness reduction process. Because of the first metal electrode 21 is always protected by the gate insulating layer 31 in this process, the first metal electrode 21 is not damaged by the etching gas, which is favorable for the stable performance of the final storage capacitor 2.

Figure 3:
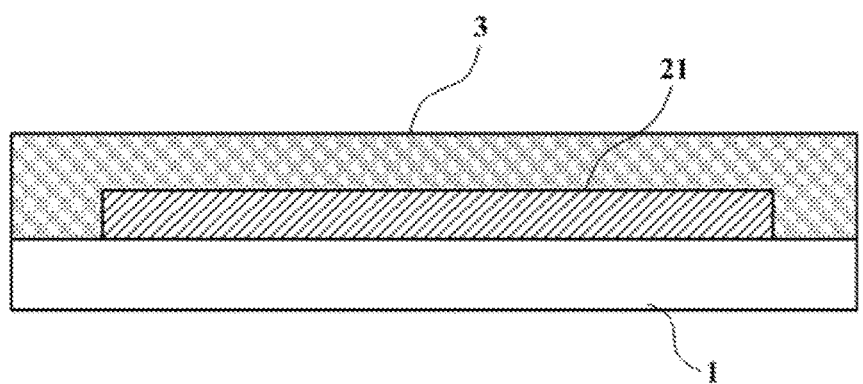
FIGS. 3-6 are schematic views showing manufacturing method of the storage capacitor according to an embodiment of the present invention.
Figure 4:
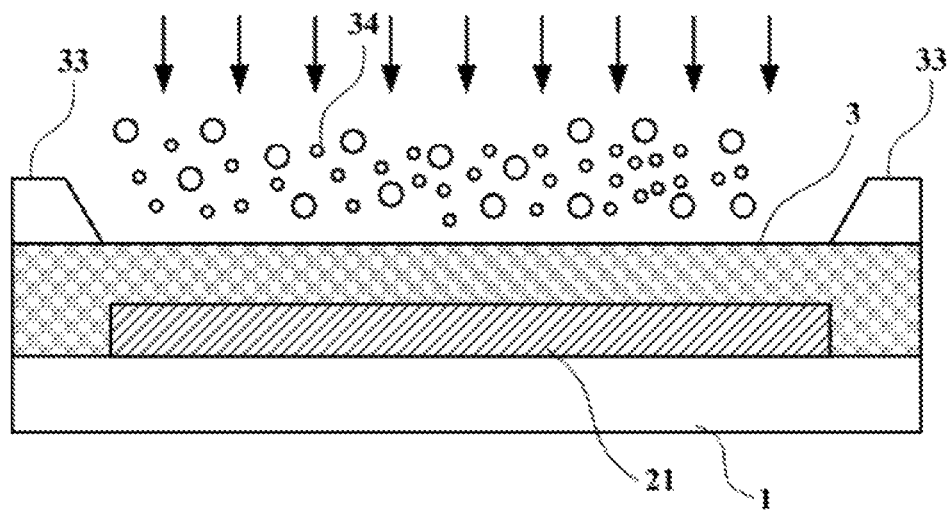
Figure 5:
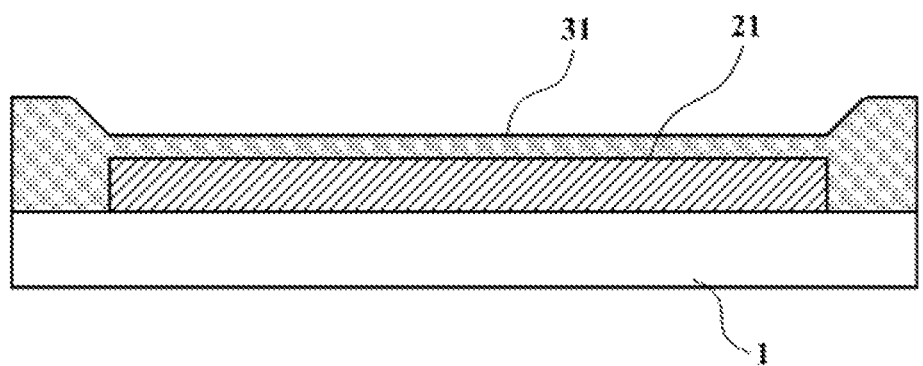
Figure 6:
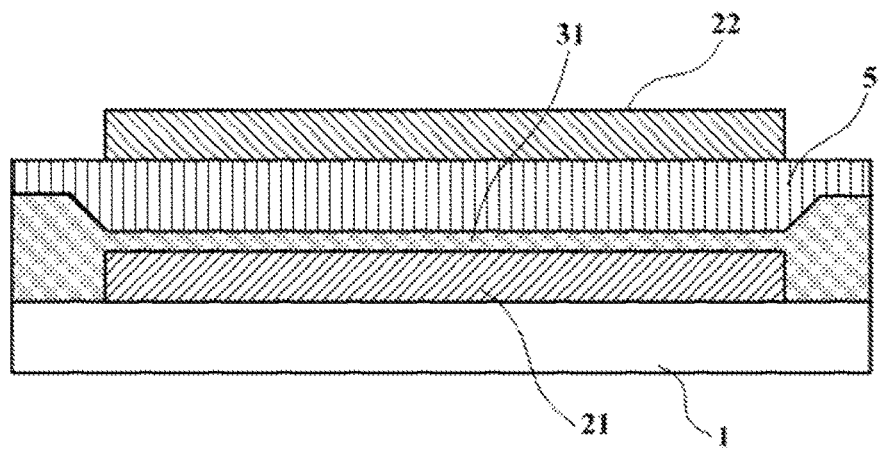

Specifically, refer to FIG. 3 to FIG. 6. In FIG. 3, the first metal layer is deposited on the substrate 1. The first metal layer is patterned to obtain the first metal electrode 21. Then, the gate insulating layer 3 is deposited on the substrate 1 and the first metal electrode 21. As shown in FIG. 4, a partial etching process is performed on the gate insulating layer 3 on the first metal electrode 21. The etching process is usually a dry etch process, for example, a photoresist layer 33 is first coated on the gate insulating layer 3 to be etched, and a portion of the gate insulating layer 3 above the first metal electrode 21 is etched away by using a half tone mask (HTM), and the gate insulating layer 3 above the first metal electrode 21 still retain a certain thickness, as shown FIG. 5. As such, the first metal electrode 21 is protected by the gate insulating layer 31 with a reduced thickness, does not come into contact with the etching gas 34, and therefore is not damaged. Referring FIG. 6, the ESL 5 is then deposited on the gate insulating layer 31 with reduced thickness, and the second metal layer is deposited on the ESL 5 and patterned to obtain a second metal electrode 22. The reduced gate insulating layer 31 and the ESL 5 thereon are used as a sandwiched layer of the storage capacitor 2. Since the thickness of the gate insulating layer 31 is reduced, the interlayer thickness of the storage capacitor 2 is not increased too much by the presence of the gate insulating layer 31. The area of the first metal electrode 21 and the second metal electrode 22 of the storage capacitor 2 remains relatively small and still maintains a high aperture ratio.

Preferably, the gate insulating layer 3 comprises two stacked layers of non-metal films. When the gate insulating layer 3 on the first metal electrode 21 is partially etched, the upper non-metal film is etched away and the underlying non-metal film is left behind, which together with the ESL 5 deposited later is used as the sandwiched layer of the storage capacitor 2.

The first metal electrode 21 and the second metal electrode 22 are made of any one or combination of: aluminum (Al), molybdenum (Mo), titanium (Ti), and copper (Cu), and is formed by a process of physical vapor deposition, chemical vapor deposition, vapor deposition, or printing.

Moreover, the TFT backplane further comprises:
an oxide semiconductor layer 4 on the gate insulating layer 32;
the ESL layer 5 on the gate insulating layer 32 and the oxide semiconductor layer 4; and a source 12 and a drain 13 on the ESL 5, the source 12 and the drain 13 contacting the oxide semiconductor layer 4.

Preferably, the ESL 5 comprises a first contact hole 51 and a second contact hole 52 respectively corresponding to above the oxide semiconductor layer 4, and the source 12 contacts the oxide semiconductor layer 4 through the first contact hole 51, and the drain 13 contacts the oxide semiconductor layer 4 through the second contact hole 52. As an example, the oxide semiconductor layer 4 is an indium gallium zinc oxide (IGZO) layer.

In the present embodiment, the TFT backplane further comprises:

a passivation layer 6 on the source 12, the drain 13, the second metal electrode 22 and the ESL 5; a planarization layer 7 on the passivation layer 6; a pixel definition layer 9 and a pixel electrode layer 8 on the planarization layer 7. The passivation layer 6 and the planarization layer 7 comprise a third contact hole 61 at a position corresponding to the drain 13, the pixel definition layer 9 comprises a fourth contact hole 91 at a position corresponding to the third contact hole 61, the pixel electrode layer 8 contacts the drain 13 through the fourth contact hole 91 and the third contact hole 61. Moreover, a photoresist spacer 90 is disposed on the pixel definition layer 9.

Figure 7:
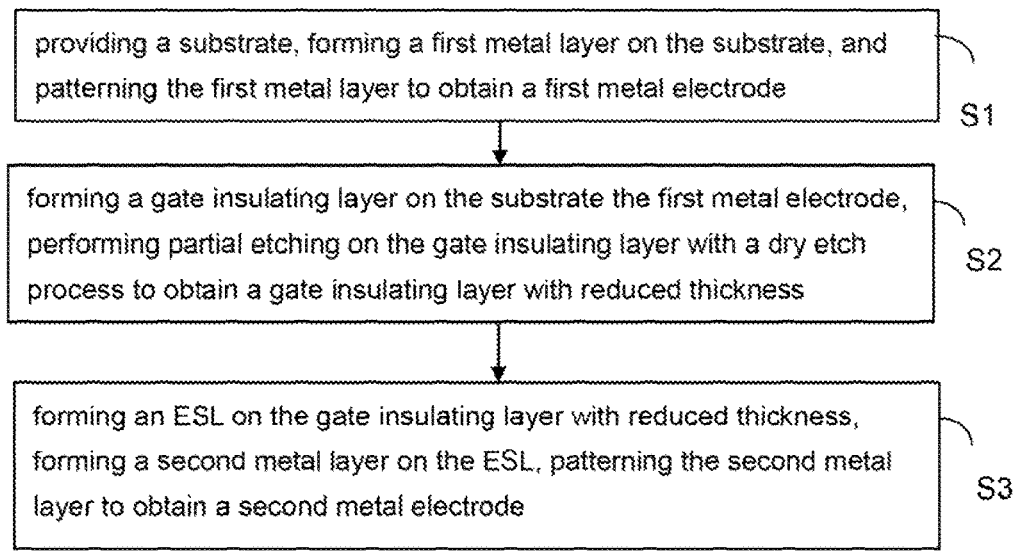
FIG. 7 is a schematic view showing the flowchart of the TFT backplane manufacturing method according to the second embodiment of the present invention.

Refer to FIG. 7. Corresponding to the TFT backplane provided by the first embodiment of the present invention, the second embodiment of the present invention also provides a TFT backplane manufacturing method, which comprises the following steps:

providing a substrate, forming a first metal layer on the substrate, and patterning the first metal layer to obtain a first metal electrode;

forming a gate insulating layer on the substrate the first metal electrode, performing partial etching on the gate insulating layer with a dry etch process to obtain a gate insulating layer with reduced thickness;

forming an etch stop layer (ESL) on the gate insulating layer with reduced thickness, forming a second metal layer on the ESL, patterning the second metal layer to obtain a second metal electrode.

Preferably, the step of patterning the first metal layer further obtains a gate, and then forming the gate insulating layer on the first metal electrode and the gate; the gate insulating layer on the first metal electrode, after thickness reduced, has a thickness less than thickness of the gate insulating layer on the gate.

Preferably, the TFT backplane manufacturing method further comprises:

forming an oxide semiconductor layer on the gate insulating layer on the gate;

forming the ESL on the gate insulating layer on the gate and the oxide semiconductor layer, forming the second metal layer on the ESL, patterning the ESL to obtain a source and a drain, the source and the drain contacting the oxide semiconductor layer;

forming a passivation layer on the source, the drain, the second metal electrode and the ESL;

forming a planarization layer on the passivation layer;

forming a pixel definition layer and a pixel electrode layer on the planarization layer.

In summary, the embodiments of the present invention provide the following advantages: in the process of manufacturing the storage capacitor, only a portion of the gate insulating layer deposited on the first metal electrode is etched through the dry etch process before depositing the etch stop layer, so that the gate insulating layer on the first metal electrode maintains a certain thickness, the first metal electrode remains protected by the gate insulating layer, so that the first metal electrode is not damaged by the etching gas, which is favorable for the stability of the final storage capacitor, improves the stability of the TFT backplane, and reduces the defects.

It should be noted that each of the embodiments in this specification is described in a progressive manner, each of which is primarily described in connection with other embodiments with emphasis on the difference parts, and the same or similar parts may be seen from each other. For the device embodiment, since it is substantially similar to the method embodiment, the description is relatively simple and the relevant description may be described in part of the method embodiment.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claim of the present invention.

What is claimed is:

1. A thin film transistor (TFT) backplane, comprising:
   a substrate;
   a gate and a first metal electrode formed on the substrate;
   a gate insulating layer formed on the substrate and including a TFT-related portion covering the gate and a capacitor-related portion covering the first metal electrode, the capacitor-related portion of the gate insulating layer that is located on the first metal electrode having a thickness less than a thickness of the TFT-related portion of the gate insulating layer that is located on the gate;
   an etch stop layer (ESL) having a capacitor-related part arranged on the capacitor-related portion of the gate insulating layer and a second metal electrode arranged on the capacitor-related part of the ESL, the first metal electrode, the capacitor-related portion of the gate insulating layer, the capacitor-related part of the ESL and the second metal electrode forming a storage capacitor;
   wherein the TFT-related portion of the gate insulating layer that is located on the gate comprises two non-metal films stacked on the gate and the capacitor-related portion of the gate insulating layer that is located on the first metal electrode comprises a single non-metal film stacked on the first metal electrode, such that a top surface of the capacitor-related portion of the gate insulating layer on the first metal electrode is recessed and lower than a top surface of the TFT-related portion of the gate insulating layer on the gate.

2. The TFT backplane as claimed in claim 1, wherein the first metal electrode and the second metal electrode are made of one or a combination of: aluminum, molybdenum, titanium, and copper, and is formed by a process of physical vapor deposition, chemical vapor deposition, vapor deposition, or printing.

3. The TFT backplane as claimed in claim 1, further comprising:
   an oxide semiconductor layer on the TFT-related portion of the gate insulating layer;
   the ESL layer including a TFT-related part arranged on the TFT-related portion of the gate insulating layer and the oxide semiconductor layer; and a source and a drain arranged on the TFT-related part of the ESL, the source and the drain contacting the oxide semiconductor layer.

4. The TFT backplane as claimed in claim 3, wherein the TFT-related part of the ESL comprises a first contact hole and a second contact hole respectively corresponding to the oxide semiconductor layer, and the source contacts the oxide semiconductor layer-through the first contact hole, and the drain contacts the oxide semiconductor layer through the second contact hole.

5. The TFT backplane as claimed in claim 3, further comprising:
   a passivation layer arranged on the source, the drain, the second metal electrode and the ESL;
   a planarization layer arranged on the passivation layer;
   a pixel definition layer and a pixel electrode layer arranged on the planarization layer.

6. The TFT backplane as claimed in claim 5, wherein the passivation layer and the planarization layer comprise a third contact hole at a position corresponding to the drain, the pixel definition layer comprises a fourth contact hole at a position corresponding to the third contact hole, the pixel electrode layer contacts the drain through the fourth contact hole and the third contact hole.

7. A manufacturing method of thin film transistor backplane, comprising the steps of:
   providing a substrate, forming a first metal layer on the substrate, and patterning the first metal layer to obtain a gate and a first metal electrode;
   forming a gate insulating layer on the substrate, the gate, and the first metal electrode, performing partial etching on the gate insulating layer with a dry etch process to obtain a TFT-related portion and a capacitor-related portion of the gate insulating layer that are respectively located on the gate and the first metal electrode, the capacitor-related portion of the gate insulating layer being formed by being partially etched off so as to have a reduced thickness that is less than a thickness of the TFT-related portion of the gate insulating layer; and
   forming an etch stop layer (ESL) on the gate insulating layer such that a capacitor-related part of the ESL is located on the capacitor-related portion of the gate insulating layer having the reduced thickness, forming a second metal layer on the capacitor-related part of the ESL, patterning the second metal layer to obtain a second metal electrode,
   wherein the gate insulating layer is formed of two non-metal films stacked on each other, wherein the TFT-related portion of the gate insulating layer comprises the two non-metal films stacked on the gate and the capacitor-related portion of the gate insulating layer is partially etched to remove one of the two non-metal films stacked on each other so as to comprise a single non-metal film stacked on the first metal electrode, wherein a top surface of the capacitor-related portion of the gate insulating layer on the first metal electrode is recessed and lower than a top surface of the TFT-related portion of the gate insulating layer on the gate.

8. The manufacturing method of TFT backplane as claimed in claim 7, further comprising:
   forming an oxide semiconductor layer on the TFT-related portion of the gate insulating layer that is located on the gate;
   forming an ESL on the TFT-related portion of the gate insulating layer and the oxide semiconductor layer, forming the second metal layer on the ESL, patterning the ESL to obtain a source and a drain, the source and the drain contacting the oxide semiconductor layer;
   forming a passivation layer on the source, the drain, the second metal electrode and the ESL;
   forming a planarization layer on the passivation layer; and
   forming a pixel definition layer and a pixel electrode layer on the planarization layer.

* * * * *